(12) United States Patent
Kim et al.

(10) Patent No.: US 11,774,858 B2
(45) Date of Patent: Oct. 3, 2023

(54) TOUCH SENSOR AND EXPOSURE MASK FOR FORMING SAME

(71) Applicant: DONGWOO FINE-CHEM CO., LTD., Iksan-si (KR)

(72) Inventors: Byoungin Kim, Seoul (KR); Cheol Hun Lee, Pyeongtaek-si (KR); Chang Gyeong Lim, Incheon (KR); Minseok Jang, Pyeongtaek-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 87 days.

(21) Appl. No.: 17/441,073

(22) PCT Filed: Mar. 13, 2020

(86) PCT No.: PCT/KR2020/003533
§ 371 (c)(1),
(2) Date: Sep. 20, 2021

(87) PCT Pub. No.: WO2020/189974
PCT Pub. Date: Sep. 24, 2020

(65) Prior Publication Data
US 2022/0179324 A1    Jun. 9, 2022

(30) Foreign Application Priority Data
Mar. 21, 2019 (KR) .......... 10-2019-0032387

(51) Int. Cl.
*G06F 3/044* (2006.01)
*G03F 7/20* (2006.01)
*G03F 7/00* (2006.01)

(52) U.S. Cl.
CPC ........ *G03F 7/70475* (2013.01); *G06F 3/0446* (2019.05); *G06F 2203/04103* (2013.01); *G06F 2203/04107* (2013.01)

(58) Field of Classification Search
CPC .............. G03F 7/70475; G06F 3/0446; G06F 2203/04103; G06F 2203/04107
See application file for complete search history.

(56) References Cited

U.S. PATENT DOCUMENTS

| 9,292,138 B2 * | 3/2016 | Gourevitch ........... G06F 3/0446 |
| 10,969,907 B2 * | 4/2021 | Gourevitch ........... G06F 3/0412 |

(Continued)

FOREIGN PATENT DOCUMENTS

| JP | 2004-212472 A | 7/2004 |
| JP | 2009-237673 A | 10/2009 |

(Continued)

OTHER PUBLICATIONS

International Search Report for PCT/KR2020/003533 dated Jun. 23, 2020 [PCT/ISA/210].

(Continued)

*Primary Examiner* — Amy Onyekaba
(74) *Attorney, Agent, or Firm* — Sughrue Mion, PLLC

(57) ABSTRACT

A touch sensor comprises a group pattern having a sensing cell part including a plurality of sensing cell groups in which a plurality of sensing cells are electrically connected and a wiring part formed outside the sensing cell part. The wiring part includes a first sub-wiring part and a second sub-wiring part. The first sub-wiring part has a drawing wire electrically connected to a sensing cell at one end of the sensing cell group. The second sub-wiring part is disposed outside the first sub-wiring part and has a non-drawing wire not electrically connected to the sensing cell part. The non-drawing wires are provided as many as the number of unit patterns repeatedly formed to constitute a large-area touch sensor minus one.

11 Claims, 3 Drawing Sheets

(56) References Cited

U.S. PATENT DOCUMENTS

| | | | | |
|---|---|---|---|---|
| 11,449,182 B2* | 9/2022 | Gogte | | G06F 3/0443 |
| 2004/0229410 A1* | 11/2004 | Takizawa | | H01L 27/1288 |
| | | | | 438/149 |
| 2011/0057887 A1* | 3/2011 | Lin | | G06F 3/0446 |
| | | | | 345/173 |
| 2012/0306776 A1* | 12/2012 | Kim | | G06F 3/0446 |
| | | | | 345/173 |
| 2014/0150571 A1* | 6/2014 | Kuniyoshi | | G01L 1/20 |
| | | | | 156/280 |
| 2014/0184952 A1* | 7/2014 | Chu | | G06F 3/0443 |
| | | | | 349/12 |
| 2014/0192027 A1* | 7/2014 | Ksondzyk | | G06F 3/0418 |
| | | | | 345/178 |
| 2014/0210784 A1* | 7/2014 | Gourevitch | | G06F 3/0443 |
| | | | | 345/174 |
| 2014/0354304 A1* | 12/2014 | Omote | | G06F 3/0443 |
| | | | | 324/658 |
| 2015/0160756 A1* | 6/2015 | Polishchuk | | G06F 3/04164 |
| | | | | 345/174 |
| 2016/0149401 A1* | 5/2016 | Chen | | H02H 9/04 |
| | | | | 361/56 |
| 2016/0299380 A1* | 10/2016 | Nam | | G02F 1/133528 |
| 2017/0308201 A1* | 10/2017 | Xie | | G06F 3/0443 |
| 2018/0157354 A1* | 6/2018 | Blondin | | G06F 3/04164 |
| 2019/0004656 A1* | 1/2019 | Hoka | | G06F 3/047 |
| 2019/0220123 A1* | 7/2019 | Kanaya | | H10K 59/40 |
| 2020/0033967 A1* | 1/2020 | Yang | | G06F 3/0448 |
| 2020/0089351 A1* | 3/2020 | Jeong | | G06F 3/044 |
| 2021/0117066 A1* | 4/2021 | Wang | | G06F 3/0446 |

FOREIGN PATENT DOCUMENTS

| | | |
|---|---|---|
| JP | 10-1068285 B1 | 9/2011 |
| JP | 2013-037629 A | 2/2013 |
| JP | 2014-109997 A | 6/2014 |
| JP | 2017-211981 A | 11/2017 |
| KR | 10-1006435 B1 | 1/2010 |
| KR | 10-2013-0136376 A | 12/2013 |
| KR | 10-2018-0013531 A | 2/2018 |
| KR | 10-2018-0110662 A | 10/2018 |

OTHER PUBLICATIONS

Written Opinion for PCT/KR2020/003533 dated Jun. 23, 2020 [PCT/ISA/237].

* cited by examiner

【Figure 1】
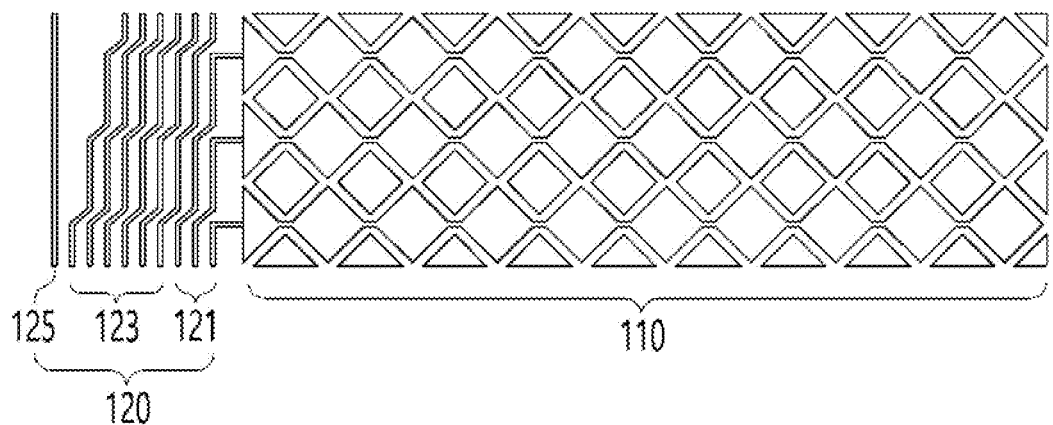
【Figure 2】
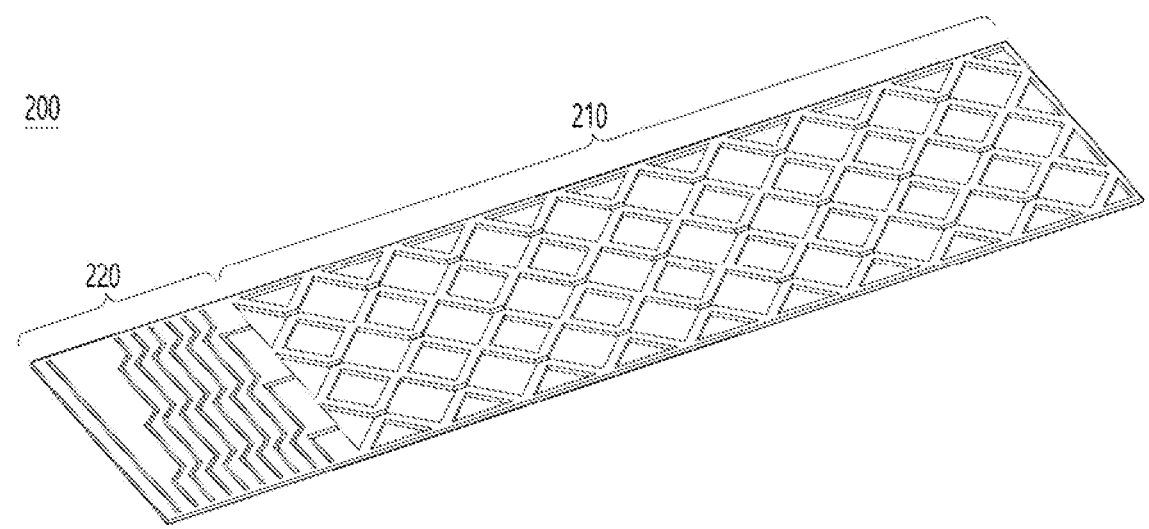

[Figure 3]
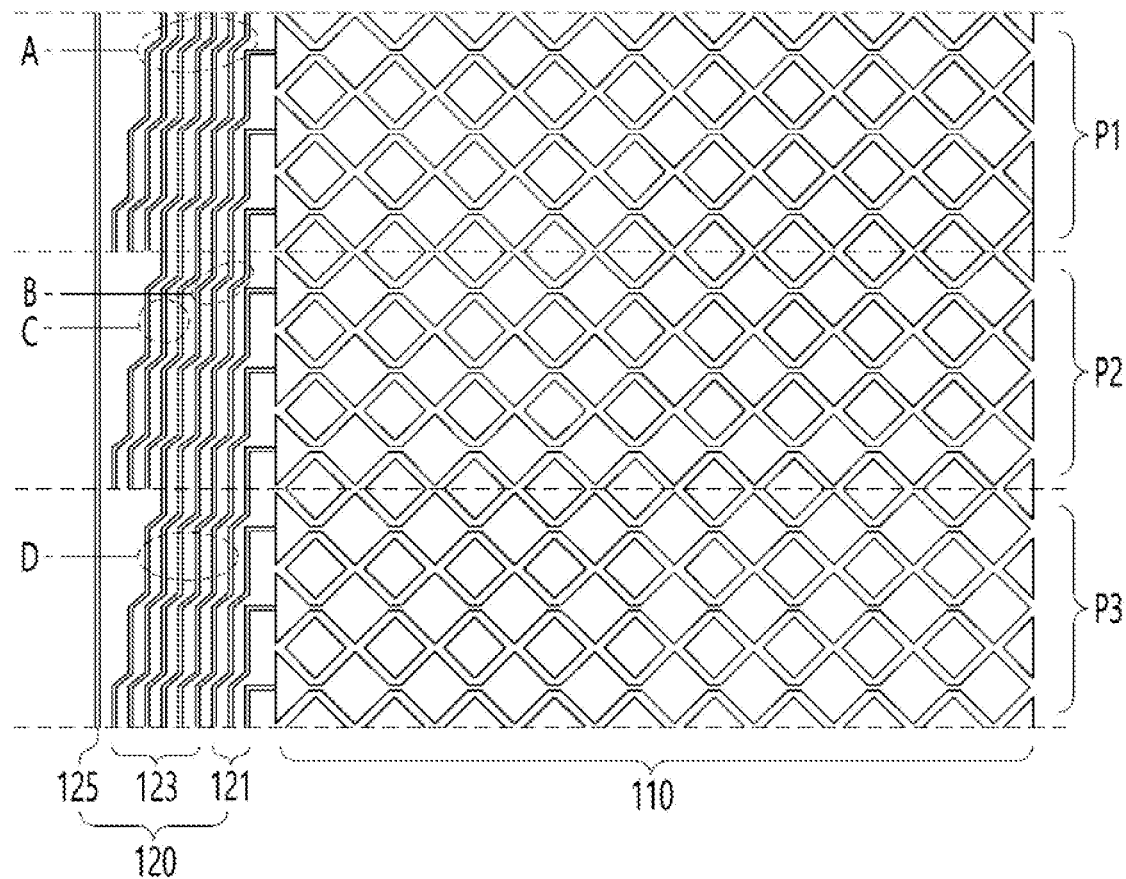

[Figure 4]
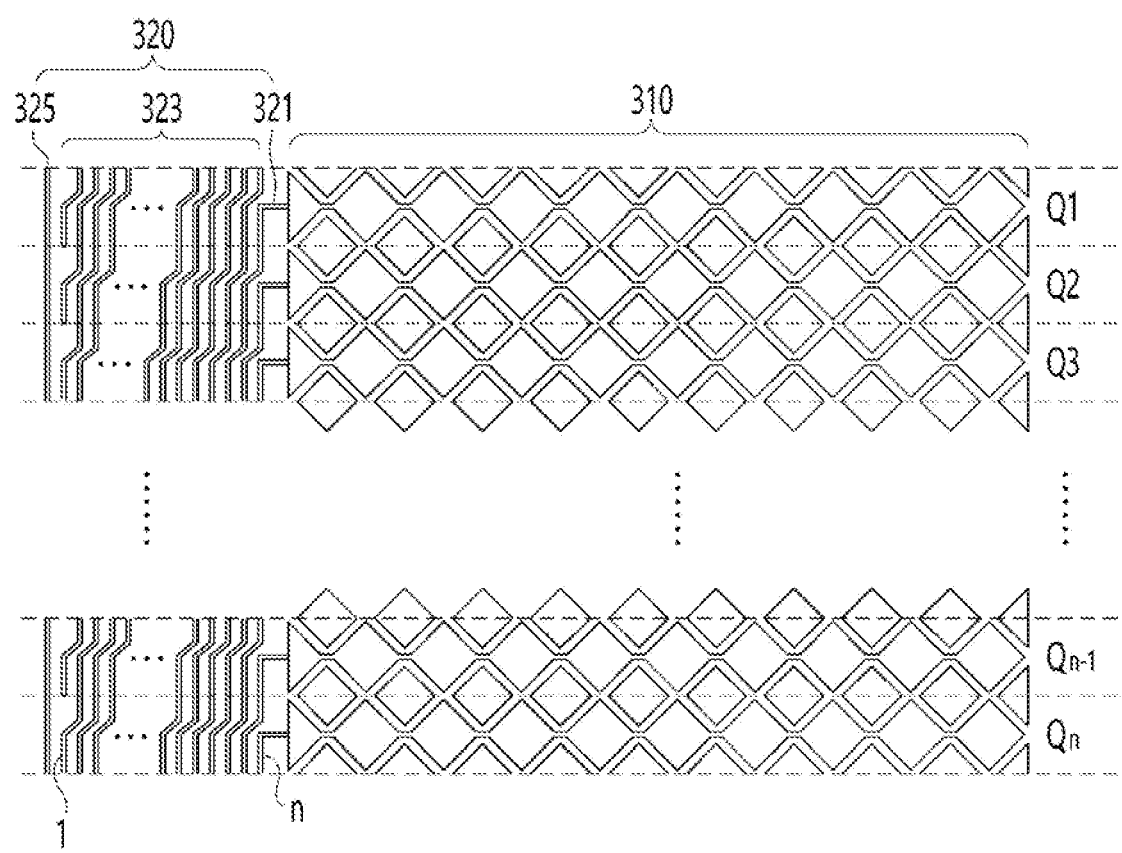

TOUCH SENSOR AND EXPOSURE MASK FOR FORMING SAME

CROSS REFERENCE TO RELATED APPLICATIONS

This is a National Stage of International Application No. PCT/KR2020/003533 filed Mar. 13, 2020, claiming priority based on Korean Patent Application No. 10-2019-0032387 filed Mar. 21, 2019, the contents of all of which are incorporated herein by reference in their entirety.

TECHNICAL FIELD

The present invention relates to a touch sensor, and more particularly, to a group pattern capable of forming a large-area pattern by a stitch method, and an exposure mask for forming the same.

BACKGROUND ART

A touch sensor of a smartphone or the like is an input device that receives a touch command. There are a resistive type, a capacitive type, an ultrasonic type, an infrared type, and so on, according to the sensing method of a touch part. Recently, the capacitive type is mainly used.

The capacitive type uses a transparent substrate on which a conductive thin film is formed. When a user touches a surface of a transparent substrate with a certain amount of voltage maintained on the surface of the transparent substrate, the voltage changes at the contact surface. Such a change in voltage is detected to sense whether it is touched.

A touch sensor may include a plurality of sensing cells arranged in X and Y axes on a transparent substrate to accurately determine the contact location. The sensing cell is formed of a rhombus shape or the like except for end portions. The sensing cells may be classified into the first sensing electrodes connected in the X axis direction and the second sensing electrodes connected in the Y axis direction, which may be respectively connected to the first and second wiring parts.

The first and second wiring parts may extend along side edges of the transparent substrate to be connected to pad electrodes formed at an edge of the transparent substrate. The pad electrode may then be connected to a flexible printed circuit board (FPCB). The FPCB may be adhered and connected to the pad electrode through an anisotropic conductive film (ACF) or the like.

According to U.S. Pat. No. 1,068,285 (Liquid crystal display device exposure mask pattern and exposure method), it discloses a method to improve stitch defects and image quality defects by performing a lego pattern exposure in sub-pixel or pixel units of a liquid crystal display device. The method comprises steps of separating a first exposure area and a second exposure area in sub-pixels in an array substrate of a liquid crystal display device and step exposing the first exposure area and the second exposure area sequentially, in which the first exposure area and the second exposure area separated in the sub-pixel are lego patterns divided into two or more, and the sub-pixel that performs exposure by separating the first exposure area and the second exposure area is composed of sub-pixels of the overlapped exposure area during separate exposure.

The prior art achieves an effect of resolving the occurrence of stitch defects when applying the exposure mask to the stitch method, but does not suggest a method of exposing a touch sensor pattern including an asymmetric wiring part other than a symmetric pattern.

DISCLOSURE OF INVENTION

Technical Problem

The present invention is to solve the above problems of the prior art and intends to provide an exposure mask and a touch sensor formed using the same that can easily form a large-area touch sensor pattern by repetitive patterning with a small-area exposure mask and can be applied to a printing method, a roll-to-roll method, etc.

Technical Solution

A touch sensor of the present invention for achieving this object may comprise a first group pattern having a sensing cell part and a wiring part.

The sensing cell part may include a plurality of sensing cell groups in which a plurality of sensing cells are electrically connected.

The wiring part may be formed adjacent to the sensing cell part.

The wiring part may include a first sub-wiring part and a second sub-wiring part.

The first sub-wiring part may be disposed adjacent to the sensing cell part and may be composed of a drawing wire electrically connected to a sensing cell at one end of the sensing cell group.

The second sub-wiring part may be disposed outside the first sub-wiring part and may be composed of a non-drawing wire not electrically connected to the sensing cell part.

The touch sensor of the present invention may comprise a second group pattern disposed adjacent to the first group pattern and having the same structure as the first group pattern. In this case, some of the non-drawing wires of the second sub-wiring part of the first group pattern may be signal transmission wires that are connected to the drawing wires of the first sub-wiring part of the second group pattern to transmit signals.

In the touch sensor of the present invention, some of the other non-drawing wires of the second sub-wiring part of the first group pattern may be dummy wires that are connected to the non-drawing wires of the second sub-wiring part of the second group pattern but do not transmit signals.

The touch sensor of the present invention may comprise a second group pattern disposed adjacent to the first group pattern and having the same structure as the first group pattern. In this case, the non-drawing wires of the second sub-wiring part of the first group pattern may be signal transmission wires that are connected to the drawing wires of the first sub-wiring part and some of the non-drawing wires of the second sub-wiring part of the second group pattern to transmit signals.

In the touch sensor of the present invention, the non-drawing wire of the second sub-wiring part may be a dummy wire that does not transmit a signal.

The touch sensor of the present invention may comprise a second group pattern disposed adjacent to the first group pattern and having the same structure as the first group pattern. In this case, some of the non-drawing wires of the second sub-wiring part of the first group pattern may be connected to some of the non-drawing wires of the second sub-wiring part of the second group pattern.

The touch sensor of the present invention may further comprise a third sub-wiring part for noise shielding outside the second sub-wiring part.

An exposure mask according to the present invention may comprise a wiring mask part having a through slit for forming a plurality of wires adjacent to a sensing cell part.

The wiring mask part may have a first and a second sub-wiring mask parts.

The first sub-wiring mask part may have a first through slit for forming a first sub-wiring part connected to a sensing cell at one end of the sensing cell part.

The second sub-wiring mask part may have a second through slit disposed outside the first sub-wiring mask part and for forming a second sub-wiring part not connected to a sensing cell of the sensing cell part.

The exposure mask according to the present invention may optionally further comprise a sensing cell mask part. The sensing cell mask part may be formed on a side of the wiring mask part and may have a through hole for forming a sensing cell of the sensing cell part.

The exposure mask according to the present invention may further comprise a third through slit for forming dummy wiring for noise shielding outside the second sub-wiring mask part.

In the exposure mask according to the present invention, there may be more second through slits than the first through slits.

A touch sensor according to the present invention may repeatedly comprise a unit pattern including a sensing cell part including a sensing cell group in which a plurality of sensing cells are electrically connected and a wiring part formed outside the sensing cell part.

The wiring part may include a first sub-wiring part and a second sub-wiring part.

The first sub-wiring part may have a drawing wire electrically connected to a sensing cell at one end of the sensing cell part.

The second sub-wiring part may be disposed outside the first sub-wiring part. The second sub-wiring part may have a non-drawing wire not electrically connected to the sensing cell part. Here, the non-drawing wires may be provided as many as the number of unit patterns repeatedly formed to constitute a large-area touch sensor minus one, or more.

The touch sensor according to the present invention may constitute a large-area touch sensor by sequentially and repeatedly forming n unit patterns. Here, n may be an integer greater than or equal to 2. When an outermost non-drawing wire is a first non-drawing wire and an innermost non-drawing wire is a (n−1)th non-drawing wire in the second sub-wiring part of the n-th unit pattern, the first non-drawing wire may be connected to the first sub-wiring part of the first unit pattern by sequentially passing through each second sub-wiring part of the adjacent (n−1)th unit pattern to the second unit pattern.

In the touch sensor according to the present invention, wires from the first non-drawing wire to the (n−1)th non-drawing wire may be electrically connected to the sensing cell part from the first unit pattern to the (n−1)th unit pattern, respectively.

The touch sensor according to the present invention may further comprise a third sub-wiring part for noise shielding outside the second sub-wiring part.

Advantageous Effects

According to the touch sensor and exposure mask of the present invention having such a configuration, a large-area touch sensor can be patterned by repeatedly using a small area exposure mask having a predetermined pattern including an asymmetric pattern of the wiring part as well as a symmetric pattern that can utilize the existing stitch method, so it is easy to form the large-area touch sensor.

According to the touch sensor and the exposure mask of the present invention, since there is no need for a large-area mask for forming a large-area pattern, the manufacturing cost can be significantly reduced.

In addition, according to the touch sensor and the exposure mask of the present invention, the exposure mask can be applied to a printing method, a roll-to-roll method, and the like, and thus can be widely utilized.

DESCRIPTION OF DRAWINGS

FIG. 1 is a plan view showing a touch sensor of a group pattern according to the present invention.

FIG. 2 is a perspective view of an exposure mask for forming a touch sensor of a group pattern according to the present invention.

FIG. 3 is a plan view of a touch sensor in which a plurality of group patterns according to the present invention are repeatedly formed.

FIG. 4 is a plan view of a touch sensor formed by connecting a plurality of unit patterns repeatedly according to the present invention.

BEST MODE

Hereinafter, embodiments of the present invention will be described in more detail with reference to the drawings. However, the following drawings attached to the present specification illustrate preferred embodiments of the present invention, and serve to further understand the technical spirit of the present invention together with the above-described content of the present invention, so the present invention should not be construed as being limited only to the matters described in such drawings.

FIG. 1 is a plan view of a group pattern according to the present invention. In FIG. 1, a sensing cell part 110 is expressed in a simplified form, and may further include a bridge (not shown) and the like in an actual form.

As shown in FIG. 1, the group pattern according to the present invention may include the sensing cell part 110, a wiring part 120, and so on.

The sensing cell part 110 may include a plurality of sensing cell groups. In a sensing cell group, a plurality of sensing cells may be electrically connected to each other by being connected in one direction. The sensing cell can be configured in the form of an island. The electrical connection between the sensing cells may be integrated by patterning with the sensing cells, or a conductive bridge may be used.

The sensing cell part 110 may be composed of a first sensing electrode in which a plurality of sensing cells are arranged and connected in a horizontal (X-axis) direction and a second sensing electrode in which a plurality of sensing cells are arranged and connected in a vertical (Y-axis) direction.

As shown in FIG. 1, the sensing cell part 110 may include a plurality of sensing cell groups which are arranged and connected in the horizontal (X-axis) direction and the vertical (Y-axis) direction. For example, it may include a first sensing cell group composed of a plurality of first sensing cells arranged and connected in a horizontal (X-axis) direction, a second sensing cell group composed of a plurality of second sensing cells spaced apart from the lower end of the first sensing cell group and arranged and connected in the horizontal (X-axis) direction, and a third sensing cell group composed of a plurality of third sensing cells spaced apart from the lower end of the second sensing cell group and arranged and connected in the horizontal (X-axis) direction. Although three sensing cell groups are shown in FIG. 1, there may be one or more sensing cell groups, and the maximum is up to the number of wires in the wiring part or the ratio of the number of wires to the number of group patterns in the entire touch sensor.

The sensing cell part 110 can be composed of a transparent conductive oxide, for example, conductive oxides such as indium tin oxide (ITO), indium zinc oxide (IZO), aluminum zinc oxide (AZO), zinc oxide (ZnOx), titanium oxide (TiO2), aluminum oxide ($Al_2O_3$). In addition, indium zinc tin oxide (IZTO), indium oxide (InOx), tin oxide (SnOx), cadmium tin oxide (CTO), gallium-doped zinc oxide (GZO), zinc tin oxide (ZTO), indium gallium oxide (IGO) or the like, or a combination of two or more thereof may also be used.

The sensing cell part 110 may be composed of a conductive metal, an alloy, or a laminate including a metal. In this case, it may be of a mesh type or the like capable of increasing light transmittance.

The wiring part 120 transmits the sensing signal of the sensing cell part 110 to a pad electrode (not shown), and may include a plurality of wires.

The wiring part 120 may be disposed in a peripheral area of the sensing cell part 110. The wiring part 120 may be disposed on one side as shown in FIG. 1, or may be disposed separately on both sides. When disposed on both sides, the wiring part 120 may be alternately connected to the end part sensing cells in the horizontal (X-axis) direction on the left and right sides.

The wiring part 120 may include a first sub-wiring part 121 and a second sub-wiring part 123.

The first sub-wiring part 121 may be configured as a drawing wire electrically connected to a sensing cell at one end of the sensing cell group to extract a signal from the sensing cell part 110. The first sub-wiring part 121 may be disposed adjacent to the sensing cell part 110.

The second sub-wiring part 123 may be disposed outside the first sub-wiring part 121, that is, farther from the peripheral area of the sensing cell part 110. The second sub-wiring part 123 may be configured as a non-drawing wire that is not electrically connected to the sensing cell part 110. The second sub-wiring part 123 may be connected to the first sub-wiring part 121 or the second sub-wiring part 123 of another group pattern repeatedly formed in the vertical (Y-axis) direction. The number of non-drawing wires of the second sub-wiring part 123 may be greater than the number of non-drawing wires of the first sub-wiring part 121 in proportion to the number of vertically arranged sensing cell groups.

As shown in FIG. 1, the wiring part 120 may include a third sub-wiring part 125 outside the second sub-wiring part 123. The third sub-wiring part 125 is dummy wiring for noise shielding and may include one or more wires.

The wiring part 120 may be formed of a conductive metal, for example, silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), or an alloy thereof (e.g., silver-palladium-copper (APC)).

FIG. 2 is a perspective view of an exposure mask for forming a group pattern according to the present invention.

As shown in FIG. 2, the exposure mask 200 according to the present invention may include a sensing cell mask part 210, a wiring mask part 220, and so on. Here, the sensing cell mask part 210 and the wiring mask part 220 mean a sensing cell exposure area and a wiring exposure area, respectively.

The sensing cell mask part 210 is for forming the sensing cell part 110 shown in FIG. 1, and a through hole or the like may be provided in an area where a sensing cell is formed.

The wiring mask part 220 is for forming a plurality of wires through exposure, and may be disposed adjacent to the sensing cell mask part 210. The wiring mask part 220 may include a through slit in an area corresponding to the wire.

The wiring mask part 220 may include a first sub-wiring mask part and a second sub-wiring mask part. The first sub-wiring mask part may form the first sub-wiring part 121 through exposure, and the second sub-wiring mask part may form the second sub-wiring part 123 through exposure. The second sub-wiring mask part may have more through slits than the first sub-wiring mask part.

As shown in FIG. 2, the wiring mask part 220 may include a third sub-wiring mask part for forming dummy wiring for noise shielding outside the second sub-wiring part. The third sub-wiring mask part may include one or more through slits.

In the exposure mask of FIG. 2, when the sensing cell and the wiring are made of the same material such as metal, the sensing cell mask part 210 and the wiring mask part 220 may be integrally formed. In the case of forming the sensing cell and the wiring with the transparent oxide and metal, respectively, the sensing cell mask part 210 and the wiring mask part 220 may be formed as separate entities.

FIG. 3 is a plan view of a touch sensor in which a plurality of group patterns according to the present invention are repeatedly formed.

As shown in FIG. 3, when the group patterns are adjacently and repeatedly patterned, three group patterns P1 to P3 having the same pattern may be formed to be connected to each other. The three group patterns P1 to P3 may be combined with each other to form a large-area touch sensor.

First, the first group pattern P1 includes the sensing cell part 110 and the wiring part 120 shown in FIG. 1. In the first group pattern P1, the wiring part 120 includes a first sub-wiring part 121 and a second sub-wiring part 123, and the first sub-wiring part 121 is electrically connected to sensing cells at one end of the sensing cell part 110 and functions as drawing wiring.

The second sub-wiring part 123 is non-drawing wiring that does not connect to the sensing cell of the sensing cell part 110, and may be dummy wiring through which all wires (area A) do not transmit signals.

The second group pattern P2 includes the sensing cell part 110 and the wiring part 120 shown in FIG. 1. In the second group pattern P2, the wiring part 120 includes a first sub-wiring part 121 and a second sub-wiring part 123, and the first sub-wiring part 121 is electrically connected to sensing cells at one end of the sensing cell part 110 and functions as drawing wiring.

In the second sub-wiring part 123, some wires (area B) function as signal transmission wires through which signals are transmitted, and other wires (area C) function as dummy wires through which signals are not transmitted.

In the second sub-wiring part 123, some inner wires (area B) transmit signals with one side connected to the first sub-wiring part 121 of the first group pattern P1 and the other side connected to some wires of the second sub-wiring part 123 of the third group pattern P3.

In the second sub-wiring part 123, some outer wires (area C) do not perform a signal transmission function because one side thereof is connected to the dummy wiring of the second sub-wiring part 123 of the first group pattern P1 and the other side thereof is not connected to the second sub-wiring part 123 of the third group pattern P3.

The third group pattern P3 includes the sensing cell part 110 and the wiring part 120 shown in FIG. 1. In the third group pattern P3, the wiring part 120 includes a first sub-wiring part 121 and a second sub-wiring part 123, and the first sub-wiring part 121 is electrically connected to sensing cells at one end of the sensing cell part 110 to function as drawing wiring.

The second sub-wiring part 123 functions as signal transmission wiring through which all wires (area D) transmit signals. In the second sub-wiring part 123, some inner wires function as signal transmission wires with one side connected to the first sub-wiring part 121 of the second group pattern P2. The remaining outer wires transmit signals of the first group pattern P1 with one side connected to the first sub-wiring part 121 of the first group pattern P1 via the second sub-wiring part 123 of the second group pattern P2 as a medium.

FIG. 4 is a plan view of a touch sensor formed by connecting a plurality of unit patterns repeatedly according to the present invention.

As shown in FIG. 4, each of the unit patterns Q1 to Qn may include one sensing cell group and a separate wiring part 320.

The sensing cell part 310 may include a plurality of sensing cells connected in a line in a horizontal direction and a plurality of sensing cells connected by a bridge (not shown) in a vertical direction.

The wiring part 320 may include a first sub-wiring part 321 and a second sub-wiring part 323.

The first sub-wiring part 321 may include a drawing wire electrically connected to a sensing cell at one end of the sensing cell group of the unit pattern to extract a signal from the sensing cell part 310. The first sub-wiring part 321 may be disposed closest to the sensing cell part 310.

The second sub-wiring part 323 may be disposed outside the first sub-wiring part 321. The second sub-wiring part 323 may include a non-drawing wire that is not electrically connected to the sensing cell part 310. The second sub-wiring part 323 may include at least as many non-drawing wires as the number of the unit patterns Q1 to Qn that are repeatedly formed to constitute a large-area touch sensor minus 1. In FIG. 4, n unit patterns Q1 to Qn are repeatedly formed to form a large-area touch sensor. In this case, the number of non-drawing wires of the second sub-wiring part 323 may be at least n−1.

As shown in FIG. 4, the wiring part 320 may include a third sub-wiring part 325 outside the second sub-wiring part 323. The third sub-wiring part 325 is dummy wiring for noise shielding and may include one or more wires.

The touch sensor of FIG. 4 exemplifies the formation of a large-area touch sensor by repeatedly forming n unit patterns Q1 to Qn having the same shape while connecting them in the vertical direction through a stitch method.

First, in the first unit pattern Q1, the wiring part 320 includes a first sub-wiring part 321 having one wire and a second sub-wiring part 323 having n−1 wires. The one wire of the first sub-wiring part 321 is electrically connected to a sensing cell at one end of the sensing cell part 310 to function as a drawing wire, and the n−1 wires of the second sub-wiring part 323 function as dummy wires that do not transmit signals.

In the second unit pattern Q2, the wiring part 320, like the first unit pattern Q1, includes a first sub-wiring part 321 having one wire and a second sub-wiring part 323 having n−1 wires. The one wire of the first sub-wiring part 321 is electrically connected to a sensing cell at one end of the sensing cell part 310 to function as a drawing wire. Among the wires of the second sub-wiring part 323, the (n−1)th wire from the outside which is adjacent to the first sub-wiring part 321 is connected to the first sub-wiring part 321 of the first unit pattern Q1 to transmit signals, and the remaining n−2 wires function as dummy wires that do not transmit signals.

When the n-th unit pattern Qn is reached by repeating the third unit pattern Q3, the fourth unit pattern Q4, etc. in sequence, one wire of the first sub-wiring part 321 is electrically connected to a sensing cell at one end of the sensing cell part 310 to function as a drawing wire, and the n−1 wires of the second sub-wiring part 323 can function as signal transmission lines that transmit respective outgoing signals of the first unit pattern Q1 to the (n−1)th unit pattern Qn−1 described above. Here, the outermost wire of the second sub-wiring part 323 transmits the outgoing signal of the first sub-wiring part 321 of the first unit pattern Q1 to an electrode pad (not shown).

As described above, in the touch sensor according to the present invention, unit patterns having a small area having the same pattern are repeatedly formed by a stitch method, so that a large area touch sensor can be easily formed.

The preferred embodiments of the present invention have been described with reference to the drawings. However, the present invention is not limited to the above-described embodiments, and it will be understood that the present invention can be implemented in a modified form without departing from the essential characteristics of the present invention. Therefore, the scope of the present invention is defined by the claims rather than the foregoing description, and all differences within the equivalent range should be interpreted as being included in the present invention.

DESCRIPTION OF REFERENCE NUMERALS 110,310: sensing cell part
120,320: wiring part
121,321: first sub-wiring part
123,323: second sub-wiring part
125,325: third sub-wiring part
200: exposure mask
210: sensing cell mask part
220: wiring mask part
A,C: dummy wiring area
B,D: signal transmission wiring area
P1,P2,P3: first to third group pattern
Q1-Qn: first to n-th unit pattern

The invention claimed is:
1. A touch sensor comprising a first group pattern including:
  a sensing cell part including a plurality of sensing cell groups in which a plurality of sensing cells are electrically connected;
  a wiring part formed outside the sensing cell part,
    wherein the wiring part includes:
      a first sub-wiring part having a drawing wire electrically connected to a sensing cell at one end of the sensing cell group; and a second sub-wiring part disposed outside the first sub-wiring part and having a non-drawing wire not electrically connected to the sensing cell part; and a second group pattern disposed adjacent to the first group pattern and having the same structure as the first group pattern, wherein some of the non-drawing wires of the second sub-wiring part of the first group pattern are signal transmission wires that are connected to the drawing wires of the first sub-wiring part of the second group pattern to transmit signals.

2. The touch sensor according to claim 1, wherein some of the other non-drawing wires of the second sub-wiring part of the first group pattern are dummy wires that are connected to the non-drawing wires of the second sub-wiring part of the second group pattern but do not transmit signals.

3. The touch sensor according to claim 2, further comprising a third sub-wiring part for noise shielding outside the second sub-wiring part.

4. The touch sensor according to claim 1, further comprising a third sub-wiring part for noise shielding outside the second sub-wiring part.

5. A touch sensor comprising a first group pattern including:

a sensing cell part including a plurality of sensing cell groups in which a plurality of sensing cells are electrically connected;

a wiring part formed outside the sensing cell part, wherein the wiring part includes:

a first sub-wiring part having a drawing wire electrically connected to a sensing cell at one end of the sensing cell group; and a second sub-wiring part disposed outside the first sub-wiring part and having a non-drawing wire not electrically connected to the sensing cell part; and a second group pattern disposed adjacent to the first group pattern and having the same structure as the first group pattern, wherein the non-drawing wires of the second sub-wiring part of the first group pattern are signal transmission wires that are connected to the drawing wires of the first sub-wiring part and some of the non-drawing wires of the second sub-wiring part of the second group pattern to transmit signals.

6. The touch sensor according to claim 5, further comprising a third sub-wiring part for noise shielding outside the second sub-wiring part.

7. A touch sensor comprising a first group pattern including:

a sensing cell part including a plurality of sensing cell groups in which a plurality of sensing cells are electrically connected;

a wiring part formed outside the sensing cell part, wherein the wiring part includes:

a first sub-wiring part having a drawing wire electrically connected to a sensing cell at one end of the sensing cell group; and a second sub-wiring part disposed outside the first sub-wiring part and having a non-drawing wire not electrically connected to the sensing cell part, wherein the non-drawing wire of the second sub-wiring part is a dummy wire that does not transmit a signal; and a second group pattern disposed adjacent to the first group pattern and having the same structure as the first group pattern, wherein some of the non-drawing wires of the second sub-wiring part of the first group pattern are connected to some of the non-drawing wires of the second sub-wiring part of the second group pattern.

8. The touch sensor according to claim 7, further comprising a third sub-wiring part for noise shielding outside the second sub-wiring part.

9. A touch sensor comprising a unit pattern including:

a sensing cell part including a sensing cell group in which a plurality of sensing cells are electrically connected; and a wiring part formed outside the sensing cell part, wherein the wiring part includes:

a first sub-wiring part having a drawing wire electrically connected to a sensing cell at one end of the sensing cell part; and a second sub-wiring part disposed outside the first sub-wiring part and having non-drawing wires not electrically connected to the sensing cell part, wherein the non-drawing wires are provided by subtracting 1 from a number of unit patterns repeated to form a large-area touch sensor;

wherein the large-area touch sensor is formed by sequentially and repeatedly forming n unit patterns, wherein n is an integer greater than or equal to 2, when an outermost non-drawing wire is a first non-drawing wire and an innermost non-drawing wire is a (n−1)th non-drawing wire in the second sub-wiring part of the n-th unit pattern, the first non-drawing wire is connected to the first sub-wiring part of the first unit pattern by sequentially passing through each second sub-wiring part of the adjacent (n−1)th unit pattern to the second unit pattern.

10. The touch sensor according to claim 9, wherein wires from the first non-drawing wire to the (n−1)th non-drawing wire are electrically connected to the sensing cell part from the first unit pattern to the (n−1)th unit pattern, respectively.

11. The touch sensor according to claim 9, further comprising a third sub-wiring part for noise shielding outside the second sub-wiring part.

* * * * *